United States Patent [19]
Jung

[11] Patent Number: 5,572,477
[45] Date of Patent: Nov. 5, 1996

[54] VIDEO RAM METHOD FOR OUTPUTTING SERIAL DATA

[75] Inventor: Seong-Ook Jung, Seoul, Rep. of Korea

[73] Assignee: Samsung Electronics Co., Ltd., Suwon, Rep. of Korea

[21] Appl. No.: 415,057

[22] Filed: Mar. 31, 1995

[30] Foreign Application Priority Data

Mar. 31, 1994 [KR] Rep. of Korea .................... 6760/1994

[51] Int. Cl.$^6$ .................................................. G11C 7/00
[52] U.S. Cl. ............... 365/221; 365/189.02; 365/189.05; 365/203; 365/49
[58] Field of Search ............................. 365/221, 189.02, 365/230.02, 230.04, 230.05, 233, 239, 240, 203, 189.05, 49

[56] References Cited

U.S. PATENT DOCUMENTS

| | | | |
|---|---|---|---|
| 4,450,538 | 5/1984 | Shirasaka | 365/189.02 |
| 4,498,155 | 2/1985 | Mohan Rao | 365/189 |
| 5,121,360 | 6/1992 | West et al. | 365/230.04 |
| 5,379,263 | 1/1995 | Ogawa et al. | 365/230.04 |

Primary Examiner—Tan T. Nguyen
Attorney, Agent, or Firm—Cushman Darby & Cushman, L.L.P.

[57] ABSTRACT

The present invention relates to a video RAM as a dual port memory, and more particularly to the video RAM which is adjustable to a high speed system clock and a serial data output method thereof. In accordance with the present invention, the video RAM having a data register which outputs a serial data in response to the input of the serial address which is synchronized with a serial clock, comprises a first data I/O line for transferring the data which is synchronized with the even serial address and then is outputted from the data register, and a second data I/O line for transferring the data which is synchronized with the odd serial address and then is outputted from the data register. The video RAM according to the present invention has independent serial data output paths respectively for even address and odd address, thus enabling the serial data to be outputted every period of the serial clock. Consequently, it is possible to reduce the operation cycle time of the video RAM and to transfer data to a CRT at a high speed. In addition, it is possible to reduce the time interval between respective periods of the system clock.

12 Claims, 4 Drawing Sheets

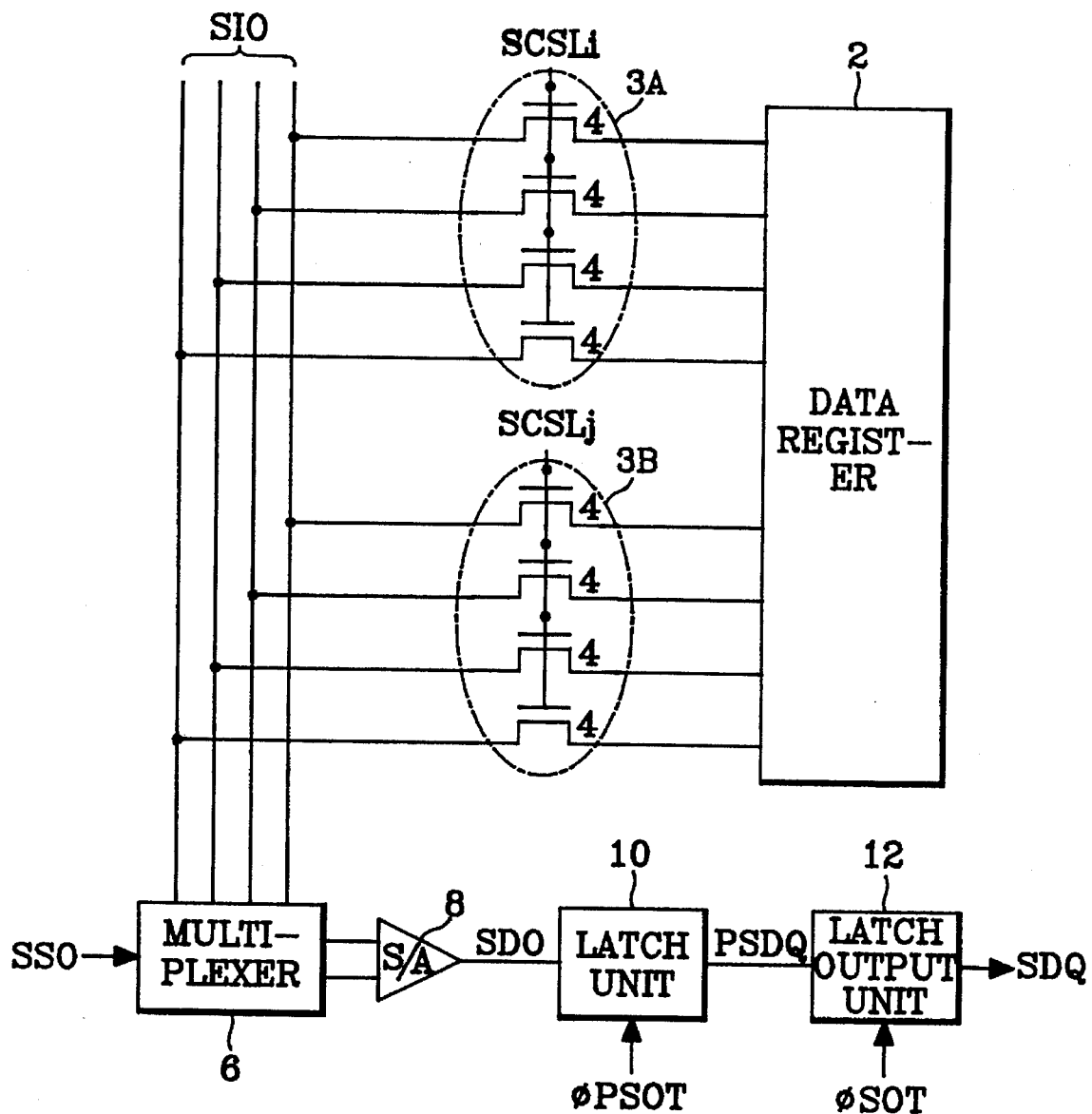
(PRIOR ART)
Fig_1

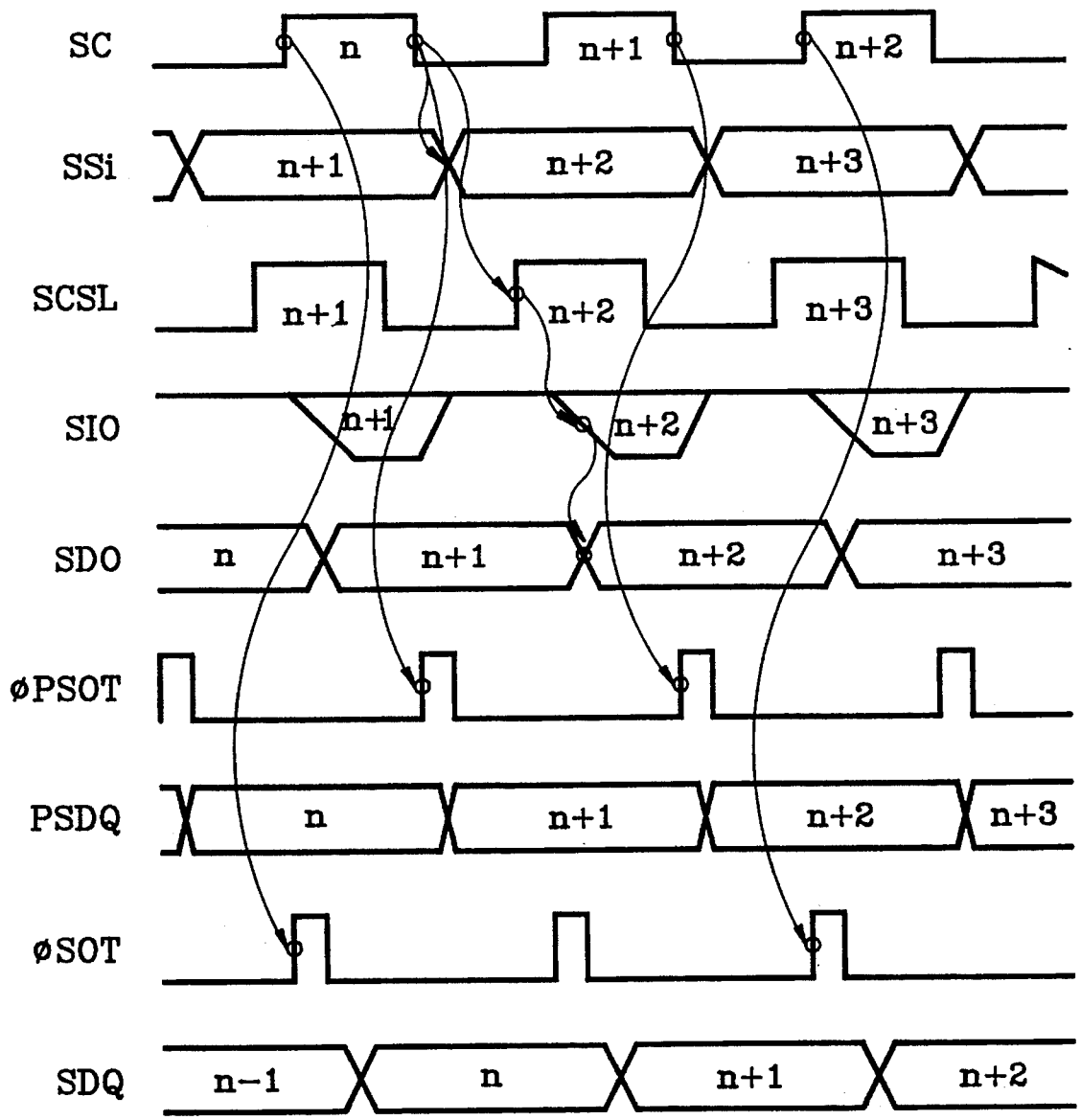
(PRIOR ART)
Fig_2

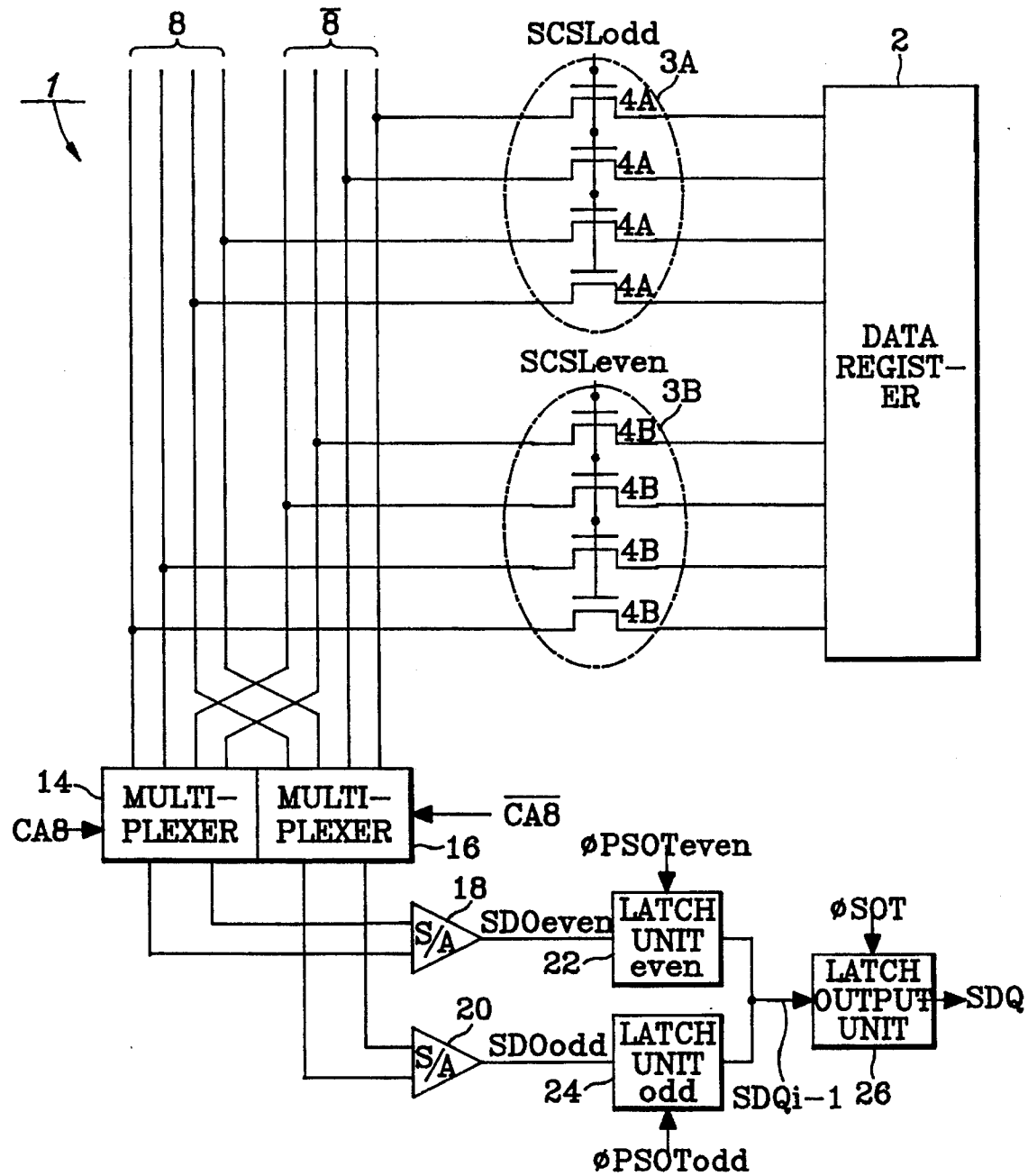
Fig_3

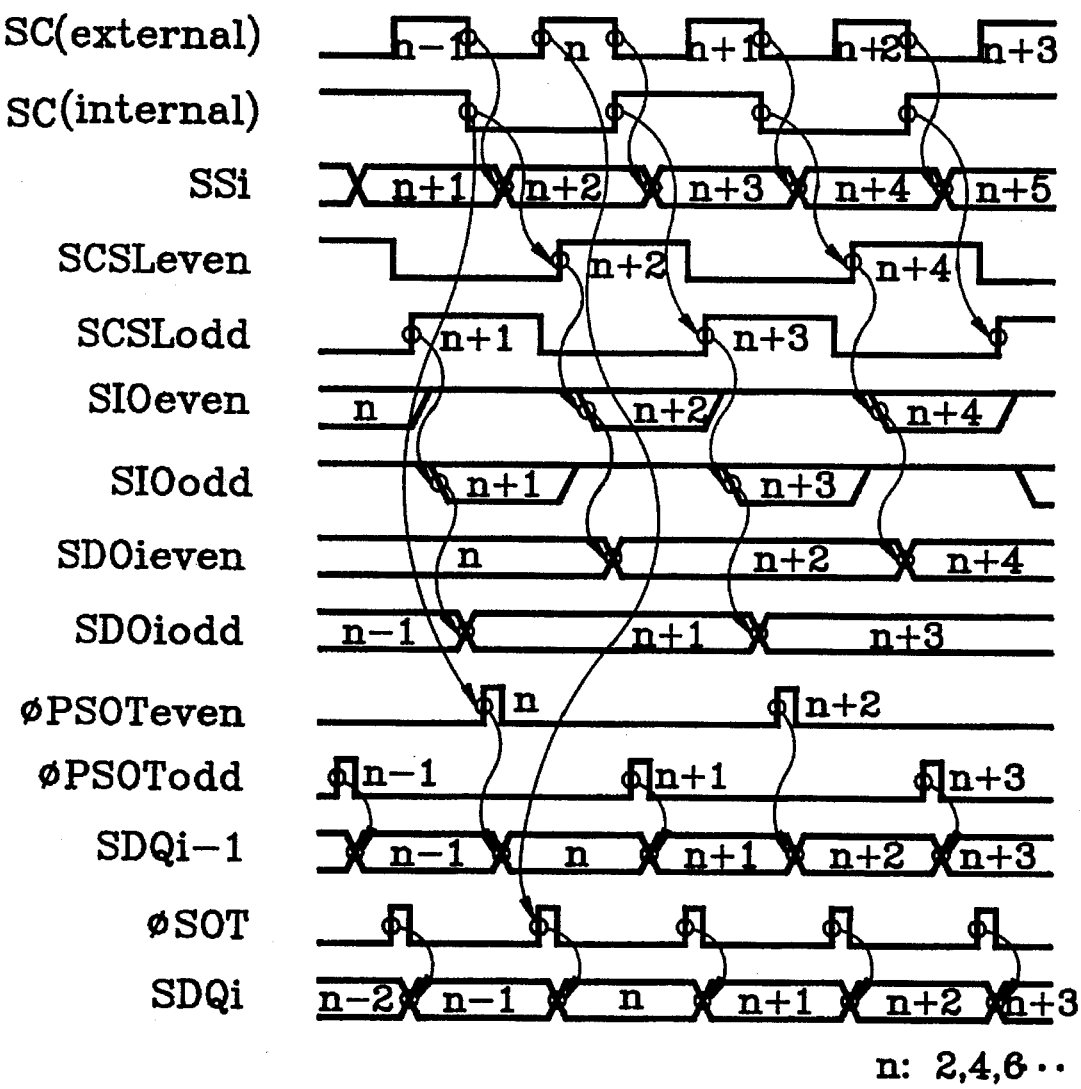
Fig_4

VIDEO RAM METHOD FOR OUTPUTTING SERIAL DATA

BACKGROUND OF THE INVENTION

The present invention relates to a video RAM as a dual port memory, and more particularly to a video RAM which is adaptable to a high speed system clock and a serial data output method thereof.

With the increased use of potable computers like a note book, the video RAMs are now very widely used in computers. A video RAM is a dual port memory which can be asynchronously utilized by adding the function of a data register which is capable of transferring data at a high speed to the function of a normal dynamic RAM. One conventional video RAM and its operation method are disclosed in U.S. patent application Ser. No. 4,498,155 entitled "Semiconductor Integrated Circuit Memory Device With Both Serial And Random Access Arrays" filed Feb. 5, 1985. Such a video RAM is designed to be able to connect a dynamic RAM port to a CPU and a high speed SAM port to an external system such as a CRT or a video camera, so that it has excellent system applicability and can have wide application. In order to diversify its functions and to store more information, highly integrated video RAM are continuing to be developed.

In a high performance graphic system, each device is required to operate in response to a high frequency in order to effectively perform the graphic interface between the computer and its user. Thus, the internal circuits in the video RAM should also operate in response to the high speed system clock supplied from the system. Such operation depends on whether the data transferred through a data I/O line within the video RAM can respond to the system clock.

FIG. 1 briefly shows the circuit elements related to data I/O lines in a conventional video RAM. FIG. 2 is an operational timing diagram of the FIG. 1 circuit. In FIG. 1, serial column gates 3 for transferring data is formed between a data register 2 and a serial data I/O line SIO. One serial column gate 3A has four serial column gate electrodes 4 commonly controlled by a serial column selection line SCSLi and another has four serial column gate electrodes 4 commonly controlled by a serial column selection line SCSLj. The serial data I/O line SIO is composed of one of the lines to receive data transferred from four serial column gates 3 in response to a single enabled of a serial column selection signal. The data on the serial data I/O line SIO is multiplexed through a multiplexer 6 and is amplified through a sense amplifier 8. The output of the sense amplifier is applied to a latch unit 10 which is controlled by the control signal φPSOT, and the output of the latch unit 10 is applied to a latch output unit 12 which is controlled by the control signal φSOT and then outputs data to externally.

Referring to the timing diagram of FIG. 2, the operational characteristic of the FIG. 1 circuit will now be described. The serial address is incremented at the falling edge of the serial clock SC. The corresponding serial column selection line is enabled on the basis of the serial address. With the enable of the serial column selection line, data stored in the data register 2 is outputted to the serial data I/O line SIO, and the sense amplifier 8 thus outputs the amplified signal SDO. Referring to FIG. 2, the signal SDO generated at the falling edge of the nth serial clock SC is latched at the falling edge of the (n+1)th serial clock SC by the control signal φPSOT, and is then output as valid data at the rising edge of the (n+2)th serial clock SC external from the chip. Such a construction having a data I/O line as shown in FIG. 1 is designed to read out data from the memory cell through a single data I/O line. Additional time is required to sense data.

However, such construction consumes large amounts of time, as described hereinafter through the data I/O line because this depends on the minimum time required in developing the serial data I/O line from the activation of the serial column selection line SCSL. Also, additional time is required for precharging and equalizing the data I/O line is required in order to prepare next read cycle, because the precharge time depends on the time required in equalizing the amplified data I/O line. In addition, extra time is required for latching the valid data which depends on the time required in generating the signal SDO that is latched by the control signal φPSOT. Since the FIG. 1 circuit is designed in consideration of the above-mentioned timing requirements, the time interval between respective serial clocks and the operation cycle is increased. This time consumption affects the operation cycle of the whole chip, and thus the cycle time is relatively increased as compared to the serial clock. This causes another in that it is difficult to transfer data at a high speed from the data register to the external display device.

SUMMARY OF THE INVENTION

It is therefore an object of the present invention to provide a video RAM which is capable of transferring data at a high speed from a data register to an external display device.

It is another object of the present invention to provide a video RAM which is capable of minimizing the operation cycle time determined by a serial clock.

It is another object of the present invention to provide a video RAM which is capable of reducing the period of each serial clock.

It is further another object of the present invention to provide a video RAM which is capable of minimizing the operation cycle time by outputting data stored in the data register while the serial data I/O line related to the next data is precharged.

It is still further another object of the present invention to provide a serial data output method of a video RAM which outputs data stored in the data register while the serial data I/O line related to the next data is precharged.

To achieve these objects, the present invention provides the video RAM which reduces the operation cycle time to be adaptable to the high speed serial clock.

The video RAM according to the present invention comprises two separate serial data I/O lines which are selected by different addresses.

In accordance with the present invention, the video RAM having a data register which outputs a serial data in response to the input of the serial address which is synchronized with a serial clock. This video RAM includes a first data I/O line for transferring data which is synchronized with the even serial address and then output from the data register. A second data I/O line transfers the data which is synchronized with the odd serial address and is then output from the data register.

In addition, in accordance with the present invention, the serial data output method of the video RAM having a data register which outputs a serial data in response to the input of the serial address which is synchronized with a serial clock includes a first step of transferring the data which is synchronized with the even serial address and then output from the data register to the first data I/O line. A second step of transfers the data which is synchronized with the odd serial address and then outputs it from the data register to the second data I/O line. A third step of synchronizes and latches the data transferred from the first step with the even serial address, a fourth step of synchronizing and latching the data transferred from the second step with the odd serial address, and a fifth step of synchronizes the serial data latched through the third and fourth steps with the serial clock and then externally outputs the synchronized serial data.

BRIEF DESCRIPTION OF THE DRAWINGS

In the detailed description of the preferred embodiment of the present invention presented below, reference is made to the accompanying drawings, in which:

FIG. 1 is a schematic diagram showing a serial data output path of a conventional video RAM;

FIG. 2 is a timing diagram of FIG. 1;

FIG. 3 is a diagram showing a serial data output path of the video RAM according to the present invention; and FIG. 4 is a timing diagram of FIG. 3.

DETAILED DESCRIPTION OF THE PREFERRED EMBODIMENT

FIG. 3 is a block circuit diagram showing the output path of the video RAM according to the present invention. As shown, the FIG. 3 circuit includes a data register 2, a serial data I/O line SIO having 8 lines for transferring data read out from the data register 2. One column gate 3 with four column gate 4A electrodes is formed between the serial data I/O line SIO and the data register 2 and is switching-controlled by the serial column selection lines SCSLodd which are selected by the odd address, for transferring data from the data register 2 to four serial data I/O lines selected by an odd address. Another column gate 3B has four column gate electrodes 4B formed between the serial data I/O line SIO and the data register 2 and is switching-controlled by the serial column selection lines SCSLeven which are selected by an even address, for transferring data from the data register 2 to four serial data I/O lines selected by the even address. Multiplexers 14 and 16 for multiplex eight serial data I/O lines responsive to the logic state("low/high") of CAB, an I/O line sense amplifier S/A 18 amplifiers the output signal of the multiplexer 14 which is connected to four serial data I/O lines selected by the even address, and an I/O line sense amplifier S/A 20 amplifies the output signal of the multiplexer 16 which is connected to four serial data I/O lines selected by the odd address. An even latch unit 22 latches the output signal SDOeven of the I/O line sense amplifier S/A 18 under the control of the signal $\phi$PSOTeven, an odd latch unit 24 latches the output signal SDOodd of the I/O line sense amplifier S/A 20 under the control of the control signal $\phi$PSOTodd, and a latch output unit 26 latches and externally outputs respective output signals of the even latch unit 22 and odd latch unit 24 in response to the control signal $\phi$SOT. As shown in FIG. 3, the serial data I/O line SIO is composed of eight lines, four of which are selected by the address 8 and the other four of which by the address $\overline{8}$. Two of four serial data I/O lines selected by the address 8 and two of the other four serial data I/O lines selected by the address $\overline{8}$ are applied to the even multiplexer 14, and the remaining four serial data I/O lines SIO are applied to the odd multiplexer 16. In FIG. 3, a single data register 2 has two independent serial data I/O lines which are selected by different addresses. Due to their selective operation, the operation cycle time can be reduced and such will be described hereinafter.

FIG. 4 is a timing diagram showing the timing between respective control signals of FIG. 3. Referring to FIG. 4, the operational characteristics of the FIG. 3 circuit will now be described. The video RAM according to the present invention is capable of being synchronized with a high speed serial clock, thus outputting the serial data by performing independent sensing operations respectively for odd and even address data. As shown in FIGS. 3 and 4, the even latch unit 22 and odd latch unit 24 are respectively controlled by the signals $\phi$PSOTeven and $\phi$PSOTodd which are alternatively enabled every two periods of the serial clock SC, and respective output signals thereof are applied to the latch output unit 26 in response to the control of the signals $\phi$PSOTeven and $\phi$PSOTodd. Enabling of the control signal $\phi$SOT is synchronized at the rising edge of each period of the serial clock SC and the data is externally output from the latch output unit 26. On the basis of such operation, while four of eight serial data I/O lines SIO perform a sensing operation to externally output data, the remaining four serial data I/O lines perform the precharge and equalization, and while the remaining four serial data I/O lines perform the sensing operation to externally output data, the former lines perform the precharge and equalization. As a result, it is possible to synchronize with the serial clock SC every period thereof and then to output serial data.

The serial data output method according to the present invention will now be described by comparing it to the conventional method. Referring to FIG. 2 which shows a timing diagram of the conventional video RAM, the serial column selection line SCSL must be precharged and equalized every cycle for a single serial address, as the corresponding serial data I/O line is accessed every cycle. However, referring to FIG. 4 showing the tinting diagram of the video RAM according to the present invention, since the serial I/O line SIO is selectively accessed corresponding to the even or odd address, the corresponding serial I/O line SIO precharges and equalizes the serial column selection line SCSL only during the corresponding cycle. With the FIG. 2 timing, the serial column selection line SCSL must be controlled with a self-pulse in order to perform the precharge and equalization However, in the FIG. 4 timing, the serial column selection line SCSL is controlled only by the address. The multiplexers 14 and 16 function to connect the corresponding serial I/O line to the I/O line sense amplifiers, depending upon the logic state of the serial address CAB. All control signals corresponding to even are operated when CA8 is in the logic "low" state, and all control signals corresponding to odd are operated when CA8 is in the logic "high" state.

As described above, the video RAM according to the present invention has independent serial data output paths for even and odd addresses, thus outputting serial data every period of the serial clock. Consequently, it is possible to reduce the operation cycle time of the video RAM and to transfer data to the CRT at a high speed. In addition, it is possible to reduce the time interval between respective periods of the system clock.

While this invention has been described with reference to illustrative embodiment, this description is not intended to be construed in a limiting sense and various modification of the illustrative embodiments will be apparent to one skilled in the art upon reference to this description.

What is claimed is:

1. A video RAM having a data register for outputting serial data in response to the input of a serial address which is synchronized with a serial clock, said video RAM comprising:

a first data I/O line for transferring even serial data which is output from the data register;

a first column gate for synchronizing the even serial data stored in said data register with an even serial address and then transferring said even serial data to said first data I/O line;

a second data I/O line for transferring odd serial data which is output from the data register;

a second column gate for synchronizing the odd serial data stored in said data register with an odd serial address and then transferring said odd serial data to said second data I/O line; and a multiplexer for multiplexing said even and odd serial data on said first and second data I/O lines in response to an input of a column address and then transferring said multiplexed data to an I/O sense amplifier, thereby selectively accessing said even and odd serial data on said first and second data I/O lines when said serial address is received.

2. A video RAM according to claim 1 wherein said even and odd serial data is transferred to said sense amplifier in consecutive clock periods so that said even serial data is amplified during a first clock period and said odd serial data is amplified during a subsequent second clock period.

3. A video RAM according to claim 1, further including:

a first latch that is switching-controlled by a first control signal which is enabled in response to input of said even serial address, for latching amplified even serial data;

a second latch that is switching-controlled by a second control signal which is enabled in response to input of said odd serial address, for latching amplified odd serial data; and a latch output for synchronizing first and second latch output data signals output from said first and second latches with the input of said serial clock and then outputting synchronized first and second data signals.

4. A video RAM according to claim 3 wherein said synchronized first and second data signals are output in consecutive clock periods so that said synchronized first data signal is output during a first clock period and said synchronized second data signal is output during a subsequent second clock period.

5. A video RAM having a data register for outputting serial data in response to the input of a serial address which is synchronized with a serial clock, said video RAM comprising:

a serial data I/O line including first and second serial data I/O lines;

a first column gate for transferring odd serial data output from said data register to said first serial data I/O line by an odd serial column selection line signal which is enabled in response to input of an odd serial address;

a second column gate for transferring even serial data output from said data register to said second serial data I/O line by an even serial column selection line signal which is enabled in response to input of an even serial address;

a first multiplexer connected to said first serial data I/O line which outputs first multiplexed data a second multiplexer connected to said second serial data I/O line which outputs second multiplexed data;

a first I/O line sense amplifier for amplifying said first multiplexed data to obtain amplified first data;

a second I/O line sense amplifier for amplifying said second multiplexed data to obtain amplified second data;

a first latch that is switching-controlled by a first control signal which is enabled in response to input of said odd serial address, for latching said amplified first data;

a second latch that is switching-controlled by a second control signal which is enabled in response to input of said even serial address, for latching said amplified second data; and a latch output for synchronizing first and second latch output data signals output from said first and second latches with the input of said serial clock and then outputting synchronized first and second data signals.

6. A video RAM according to claim 5 wherein said synchronized first and second data signals are output in consecutive clock periods so that said synchronized first data signal is output during a first clock period and said synchronized second data signal is output during a subsequent second clock period.

7. A video RAM according to claim 5 wherein during a first clock period when said second multiplexed data is being amplified by said second I/O lines sense amplifier, said first I/O line sense amplifier is being precharged and equalized and during a subsequent second clock period when said first multiplexed data is being amplified by said first I/O line sense amplifier, said second I/O line sense amplifier is being precharged and equalized.

8. A video RAM according to claim 7 wherein said synchronized first and second data signals are output in consecutive clock periods so that said synchronized first data signal is output during a first clock period and said synchronized second data signal is output during a subsequent second clock period.

9. A video RAM according to claim 8 wherein said first I/O line sense amplifier is equalized and precharged during said first clock period and said second I/O lines sense amplifier is precharged and equalized during said subsequent second clock period.

10. A serial data output method for a video RAM having a data register for outputting serial data in response to input of a serial address which is synchronized with a serial clock, said method comprising:

a first step of transferring even data which is synchronized with an even serial address and then is output from said data register to a first data I/O line;

a second step of transferring odd data which is synchronized with an odd serial address and then is output from said data register to a second data I/O line;

a third step of synchronizing said even data transferred from said first step with an even serial address to obtain odd even synchronizing data and then latching said even synchronizing data to obtain even latched data;

a fourth step of synchronizing said odd data transferred from said second step with an odd serial address to obtain odd synchronizing data and then latching said odd synchronized data to obtain odd latched data; and a fifth step of synchronizing said even and odd latched data with said serial clock to obtain synchronized even and odd serial data and then externally outputting said synchronized even and odd serial data.

11. A method according to claim 10, wherein said fifth step of synchronizing includes the step of synchronizing said synchronized even and odd serial data so that said synchronized even serial data is externally output during a first clock period and said synchronized odd serial data is externally output during a subsequent second clock period.

12. A method according to claim 11 wherein said first through fifth steps are repeated so that one of said synchronized even and odd serial data is sequentially output during a plurality of sequential clock periods of said serial clock.

* * * * *